United States Patent [19]

Nakajima et al.

[11] Patent Number: 5,270,572
[45] Date of Patent: Dec. 14, 1993

[54] LIQUID IMPINGEMENT COOLING MODULE FOR SEMICONDUCTOR DEVICES

[75] Inventors: Tadakatsu Nakajima, Ibaraki; Shigeo Ohashi, Tsuchiura; Heikichi Kuwahara, Ibaraki; Noriyuki Ashiwake, Tsuchiura; Motohiro Sato, Ibaraki; Toshio Hatsuda, Ibaraki; Takahiro Daikoku, Ushiku; Toshio Hatada, Tsuchiura; Shigeyuki Sasaki, Ibaraki; Hiroshi Inouye, Ibaraki; Atsuo Nishihara, Ibaraki; Kenichi Kasai, Hadano, all of Japan

[73] Assignee: Hitachi, Ltd., Japan

[21] Appl. No.: 903,458

[22] Filed: Jun. 24, 1992

[30] Foreign Application Priority Data

Jun. 26, 1991 [JP] Japan ................ 3-154667

[51] Int. Cl.⁵ .............. H01L 23/02; H01L 25/04
[52] U.S. Cl. .................... 257/714; 257/715; 257/721; 361/689; 361/699; 174/15.1; 165/80.4; 165/104.33
[58] Field of Search ............... 257/714, 715, 716, 721; 361/382, 384, 385; 174/15.1, 16.1; 165/80.4, 104.33

[56] References Cited

U.S. PATENT DOCUMENTS

| | | |
|---|---|---|
| 4,138,692 | 2/1979 | Meeker et al. ............ 257/714 |
| 4,590,538 | 5/1986 | Cray, Jr. ............ 361/385 |
| 4,740,866 | 4/1988 | Kajiwara et al. ............ 361/382 |
| 4,748,495 | 5/1988 | Kucharek ............ 361/382 |
| 4,783,721 | 11/1988 | Yamamoto et al. ............ 257/714 |
| 4,939,621 | 7/1990 | Galian et al. ............ 361/382 |
| 5,016,090 | 5/1991 | Galyon et al. ............ 257/714 |
| 5,021,924 | 6/1991 | Kieda et al. ............ 361/385 |
| 5,023,695 | 6/1991 | Umezawa et al. ............ 361/382 |
| 5,063,476 | 11/1991 | Hamadah et al. ............ 361/384 |
| 5,103,374 | 4/1992 | Azar ............ 361/382 |

FOREIGN PATENT DOCUMENTS

| | | |
|---|---|---|
| 59-145548 | 11/1983 | Japan . |
| 60-134451 | 12/1983 | Japan . |
| 234183 | 4/1984 | Japan . |
| 37960 | 6/1984 | Japan . |
| 222848 | 7/1988 | Japan . |
| 282561 | 9/1988 | Japan . |
| 2237200 | 3/1989 | Japan . |

OTHER PUBLICATIONS

A. H. Johnson 'Diaphragm Cooling for Devices', IBM Tech. Dis. Bull., vol. 20 No. 8, Jan. 1978 p. 3121.
Heat Transfer in Electronics, 1989 ASME Htd vol. 111, pp. 79–87.

Primary Examiner—Rolf Hille
Assistant Examiner—David Ostrowski
Attorney, Agent, or Firm—Evenson, McKeown, Edwards & Lenahan

[57] ABSTRACT

A semiconductor cooling unit for directly jetting a cooling medium against surfaces of semiconductor devices for use in a high-speed computer or the like to effectively remove heat from the semiconductor devices, in which partition members for partitioning a space into regions where semiconductor devices are placed. Each partitioned region has an opening at its ceiling side, and a pipe for supplying or discharging the cooling medium through the opening is disposed so as to project toward a central portion of the back surface of each semiconductor device. This pipe is utilized to also section a cooling medium supply header or a cooling medium return header so that bubbles generated from the semiconductor device surfaces can be smoothly removed, and so that the cooling medium can flow smoothly onto the semiconductor devices.

24 Claims, 10 Drawing Sheets

LIQUID IMPINGEMENT COOLING MODULE FOR SEMICONDUCTOR DEVICES

BACKGROUND OF THE INVENTION

This invention relates to an apparatus for cooling high-power density devices such as semiconductor devices and, more particularly, to a semiconductor liquid-impingement cooling module suitable for efficiently removing heat generated from semiconductor devices for use in a high-speed computer.

With the development of the technology for highly integrating semiconductor devices (elements) and highly densely packaging semiconductor devices (elements) on a base, various means have been studied to remove large amounts of heat generated from semiconductor devices. Semiconductor devices having a very large calorific value have recently been developed and, to cool such devices, a direct liquid cooling system to be used instead of forced convective air cooling systems or thermal conduction cooling systems has been proposed in which a semiconductor device is cooled by being directly immersed in a dielectric cooling medium so that heat is transferred by forced convection, forced convective boiling or pool boiling.

Cooling units based on a forced convective heat transfer system using a single phase liquid flow are known, which are, for example, one in which printed circuit boards on which a multiplicity of semiconductor devices are mounted are stacked and a cooling medium liquid is caused to flow between the printed circuit boards to cool the semiconductor devices (U.S. Pat. No. 4,590,538), and one in which an array of a multiplicity of heat sink fins are attached on the back side of semiconductor devices and a cooling medium liquid is caused to flow between the heat sink fins to cool the semiconductor devices (Japanese Patent Unexamined Publication No. 60-134451). In these cooling units, since semiconductor devices are arranged in one row in the direction along the cooling medium liquid flow, the temperature of the cooling medium liquid is increased in the flowing direction and the temperature of the semiconductor devices is gradually increased in the downstream direction, so that it is difficult to uniformly maintain the temperature of the semiconductor devices. This tendency is particularly conspicuous if the cooling medium used is an organic cooling medium having a small specific heat. However, cooling medium liquids available for use in these cooling units are needed to have suitable electric insulating performance and chemical stability and are limited to organic cooling liquids. In this type of cooling unit, therefore, the problem of non-uniformity of semiconductor device temperature is serious. Moreover, the thermal conductivity of organic liquids is very small, about 1/10 of that of water. It is therefore difficult to obtain a high forced convection heat transfer coefficient, and the efficiency of cooling semiconductor devices is necessarily low. To solve these problems, a type of cooling unit has been proposed (U.S. Pat. No. 5,021,924) in which nozzles are disposed in a one-to-one relationship with semiconductor devices in the vicinity of back surfaces thereof to cool the devices with a wall jet flow. Because a cooling medium liquid is separately supplied to each semiconductor device in this cooling unit, the non-uniformity of the temperatures of the semiconductor devices caused with increasing the liquid temperature can be reduced. Also, the thickness of velocity/temperature boundary layers can be reduced by the wall jet flow, so that a higher heat transfer coefficient can be obtained in comparison with the cooling units described above. In the design of this cooling unit, however, while the supply of the cooling medium liquid to each semiconductor device is achieved by disposing the nozzles in correspondence with the semiconductor devices, only the provision of the cooling medium liquid outlet port above each device has been considered with respect to discharge of the cooling medium liquid from each device. Therefore, the flow rate of the jet from a nozzle provided at the upstream portion of the discharged flow is necessarily smaller than the flow rate of another nozzle provided at the downstream portion because of a pressure loss effect. Also, no means is provided to completely discharge through each outlet port the cooling medium liquid supplied to the corresponding semiconductor device. A part of the cooling medium liquid supplied to a device placed at the upstream portion and warmed by this device flows to a device placed at the downstream portion, so that the temperature of the cooling medium liquid on the downstream portion is necessarily higher than the temperature on the upstream portion. These two unbalances cause non-uniformity of the performance of cooling the semiconductor devices and, hence, non-uniformity of the temperatures thereof. Although the heat transfer coefficient of a wall jet flow is higher than that of the ordinary internal flow, the former is at most 2 or 3 times higher than the latter. The heat loads which can be removed from semiconductor devices by using the above-mentioned organic liquid is at most 10 to 20 W/cm$^2$ under the condition of an actually attainable liquid flow rate.

A pool boiling heat transfer type cooling unit is known as one of other major systems for cooling a high-power density devices. In this cooling unit, a group of devices are immersed in a pool of cooling medium at saturated condition and the devices are cooled by boiling of the liquid. For example, Japanese Patent Examined Publication No. 2-34183 discloses a cooling unit in which boiling enhancing fins having a multiplicity of fine cavities are attached to a back surface of a device, and boards on which a multiplicity of devices with such fins are attached are immersed together in a cooling medium liquid to cool the devices. This cooling unit achieves greatly improved device cooling performance in comparison with the above-mentioned force convection system because boiling enhancing fins are attached to the devices. In this cooling unit, however, it is necessary to remove the entire heat generated from the devices by vaporization of the cooling medium. The amount of vapor generated a the devices is therefore increased excessively, and a very large sectional area of a vapor flow path is required. The distance between the devices or between the device boards is thereby increased, and the problem of an increase in delay time of computing logical operation and a reduction in computation speed due to an increase in wiring distance is thereby encountered. Also, a large amount of vapor bubbles generated at each device pass around the other devices, and the boiling heat transfer coefficient is changed according to the amount of the bubbles, so that the temperatures of the devices are not uniform. Further, a vapor choking phenomenon occurs around some of the devices by concentration of vapor bubbles, and there is a risk of occurrence of dryout at that device. A cooling medium container for accommodating a multiplicity of boards must be a completely sealed container for maintaining the cooling medium at a saturated condition. There is therefore the problem such as a complicated structure for leading power supply or signal lines from the boards out of the container, a complicated sealing structure, and troublesome operations for repairing the devices on the boards.

A type of cooling unit using a combination of forced convection heat transfer and boiling heat transfer has also been provided. For example, Japanese Patent Unexamined Publication No. 2-22848 discloses a cooling system in which a multiplicity of devices are mounted in an inclined tubular path through which a cooling medium liquid is caused to flow downwardly along a slope while being boiled at each device. In this cooling unit, a cooling medium main flow direction component of the buoyancy of boiling bubbles generated at each device is directed to a direction just opposite to the direction of the main flow to direct the bubbles to a ceiling side of the tubular path remote from the base on which the devices are arranged, thereby reducing bubbles generated at upstream devices flowing into regions around downstream devices. A certain effect of this system has been confirmed. In this cooling unit, however, the amount of bubbles in the liquid flow in the vicinity of the base cannot be made uniform above the devices from the upstream to downstream positions, and occurrence of a situation where downstream devices are easily covered with the bubbles cannot be prevented if high-power density devices which can generate particularly large amount of bubbles are mounted. Moreover, since the effect of forced convective boiling heat transfer depends greatly upon the subcooled temperature of the liquid, the heat transfer coefficient of downstream devices is reduced in a structure in which downstream devices are cooled with the cooling medium liquid warmed by upstream devices. Because of the increase in the amount of bubbles and the reduction in heat transfer coefficient caused in this manner in the regions around downstream devices, the temperatures of the devices cannot be made uniform and the burnout heat flux corresponding to the limit of nucleate boiling cannot be sufficiently increased, so that the allowable heat loads of the devices, i.e., the amount of heat sufficiently removed by cooling cannot be increased. Japanese Utility Model Examined Publication No. 3-7960 discloses a cooling unit directed to the subject for increasing the allowable heat loads, in which impinging jet and boiling as combined. This cooling unit has a sealed cooling medium container which is formed of a section in which a board on which a plurality of semiconductor devices are arranged is immersed in a cooling medium liquid, and a cooling medium inlet header section from which the cooling medium is jetted to each device through nozzles. Boiling bubbles generated on a surface of each device are forcibly removed by the cooling medium liquid jetted through the nozzle. This cooling unit is thus arranged to improve the cooling performance and to cool devices having a heat load of about 10 W. Actually, in this cooling unit, boiling bubbles can be forcibly expelled from the device surfaces to improve the burnout heat flux and to increase the allowable heat loads. However, the influence of a flow of boiling bubbles generated from devices in lower positions to devices in upper positions has not been considered. Therefore an upward cooling medium flow containing bubbles warmed by lower devices flows into the regions of upper devices while increasing the liquid temperature and the amount of bubbles as it passes each device, so that the temperature of devices in upper positions is higher. If the heat loads of each device is large, the amount of bubbles around devices in upper positions is extremely increased to cause dryout at the devices, resulting in a reduction in the allowable heat loads. The problem of this temperature increasing of the upper devices and this reduction in cooling performance is serious with respect to present semiconductor devices having greater heat loads, i.e., 50 to 100 W devices. In addition the structure in which the whole board is immersed in the container has been adopted without considering leading a number of connection wires and signal wires on the order of several hundreds out of the container, the increase in logical operation delay time with the increase in the overall length of wires for wiring between a plurality of the containers or between the inside and the outside of each container, and maintenance facility with respect to device repairs and the like. Trials have been made to solve these problems and to avoid mutual interference between devices. For example, in HEAT TRANSFER IN ELECTRONICS 1989, ASME HTD-Vol. 111, pp 79 to 87 is proposed a cooling unit structure in which nine heaters used to simulate semiconductor devices are arranged in three rows and three columns on a base, and a cooling block having nine rectangular nozzles arranged in three rows and three columns so as to respectively face back surfaces of the heaters is provided on the base on which the heaters are mounted. The nozzle block in which nozzle orifices are formed is positioned with spacers provided above and below each row of nozzles so as to be spaced at a distance of 0.5 to 5 mm from the heaters. A restricted rectangular cooling medium flow path is formed between the nozzle block and each column of heaters. A cooling medium jetted from each nozzle to the surface of the corresponding heater impinges against the heater, changes its flowing direction through 90°, and flows through the rectangular flow path along a line tangent to the heater surface. Each spacer serves as a partition means between each adjacent pair of heaters to prevent mutual interference between the heaters in cooperation with partition plates extending longitudinally between the heaters. In this cooling unit, however, the cooling medium liquid jetted from each nozzle flows out of the flow path while being heated by the corresponding heater forming a part of the rectangular flow path and thereby generating bubbles. Therefore, the percentage of voids is increased toward the downstream end, and a vapor-liquid two-phase flow pattern is changed on the heater surfaces, so that a large temperature difference is produced between the heater surfaces. Also, since the flow path diameter for the two-phase flow is so small that flow pressure loss is very large. The pumping power for driving the cooling medium liquid is therefore increased and there is also a risk of the base being broken due to the increase of pressure on the heater. Further, as the cooling medium flowing out of each rectangular flow path in the two-phase state moves upward through the vertical flow path defined by the partition plates between the columns of the devices, the amount of bubbles in this flow generated by each heater is increased, so that bubbles generated by the heaters placed at the lower side influence on the upper side heaters, thereby causing differences between the temperatures of the heaters. In a situation similar to that described above wherein the vapor-liquid two-phase flow state varies with respect to the heater positions, if devices having different heat loads are used as in the case of an actual semiconductor device board the amount of bubbles generated at devices having a smaller heat load is small and the two-phase flow loss in the rectangular flow path is therefore small, while the flow loss is increased with respect to devices having a greater heat load, resulting in no-uniformity of distribution of the cooling medium liquid to the nozzles. Because of this non-uniformity, the flow rate is increased with respect to the lower heat loads devices with the smaller flow loss while the flow rate is reduced with respect to the higher heat loads devices the greater flow loss. This condition leads to a result contrary to an actual need for higher cooling performance for high heat leads devices.

A cooling unit also designed to reduce the mutual interference between devices is disclosed in Japanese Unexamined Patent Publication No. 2-237200. In this cooling unit, a multiplicity of countersunk holes formed in a wall of a liquid cooling medium header are placed above devices and the devices are separated from each other by these holes. In this cooling unit, however, cooling medium flow paths between the countersunk holes and the devices connecting device cooling cells and the cooling medium header are formed at a position offset from center axes of the device cooling cells such that the flow of the liquid cooling medium jetted through each nozzle cannot be formed as an axially symmetrical flow on the device surface. Owing to this asymmetry, considerable temperature non-uniformity is produced in each device and the cooling medium liquid stays at a device surface portion opposite to a cooling medium outlet position. The risk of occurrence of burn-out from this portion is large. Owing to this asymmetry, as well, bubbles stay at ceiling portions of each device cooling cell outside the region where the cooling medium path is formed, thereby promoting dryout of the device cooling cell. A phenomenon can also occur in which formation of large bubbles and release of bubbles to the outside of each device cooling cell repeat alternately so that the cooling medium pressure in each device cooling device changes pulsatingly and so that the device temperature fluctuates. Further, contraction and enlargement of the flow path upstream and downstream of the cooling medium outlet may cause the flow loss of the cooling medium to be arbitrarily increased and make the vapor-liquid two-phase flow unstable, resulting in instability of the device temperature.

None of the above-described cooling units cannot solve all the problems of the variation in temperature in each device, difference between the temperatures of devices, the reduction in the allowable calorific value due to dryout caused by an increase in the amount of bubbles, the non-uniformity of distribution of the cooling medium liquid due to an unbalance of flow loss, the reduction in the allowable calorific value due to the reduction in the rate of liquid to some of the devices, and so on.

Also, the above-described conventional cooling units entail the problem of failure to limit variation in the temperature of each semiconductor device and the change in the pressure applied to the board because of instability of the two-phase flow.

SUMMARY OF THE INVENTION

An object of the present invention is to provide a semiconductor liquid-impingement cooling unit which is designed to improve the performance of cooling each of semiconductor devices mounted on a substrate to reduce the temperature differences between internal portions of each semiconductor device and between the semiconductor devices, and which is designed to reduce flow pressure losses due to bubbles formed by evaporation of the liquid liquid to limit changes in the pressure applied to the substrate.

To achieve this object, according to the present invention, there is provided a semiconductor cooling unit having a liquid supply header for supplying a cooling medium to a plurality of semiconductor devices arranged on a substrate, at least one cooling medium jet port projecting from the cooling medium supply header and capable of jetting the liquid against a back surface of each semiconductor device, and a liquid return header communicating with each liquid jet port and disposed adjacent to the liquid supply header, the semiconductor cooling unit comprising a plurality of partition members having a predetermined height and partitioning an internal space at positions between the semiconductor devices to define a plurality of device cooling cells. Each liquid jet port is connected to a liquid supply member and mounted by being inserted in corresponding one of the device cooling cells while being spaced at a predetermined distance from the corresponding semiconductor device. Each partition member and adjacent one of the liquid supply members define a liquid discharge opening therebetween, and the partition members and the liquid supply header define the liquid return header therebetween. The liquid jetted to the back surface of each semiconductor device is guided to the liquid return header away from the back surface.

In the semiconductor cooling unit thus constructed in accordance with the present invention, the partition members are provided between the semiconductor devices (elements) to form the device cooling cells, and each cooling jet port is inserted in the device cooling cell, so that the liquid jetted to the back surface of each device impinges against this surface and thereafter moves away from the back surface by being guided by the partition members to be discharged through the liquid return header. Each device can therefore be cooled independently without being influenced by jet flows from the liquid jet ports for other devices. When the liquid in a vapor-liquid two-phase state impinges against the partition members, bubbles and the liquid are violently mixed so that the bubbles reduce or disappear, and so that the flow resistance to the vapor-liquid is reduced. The heat transfer coefficient is also improved and the temperature distribution of each device can be made uniform.

DESCRIPTION OF THE PREFERRED EMBODIMENTS

The first embodiment of the present invention will be described below with reference to FIGS. 1 and 2.

Figure 1:
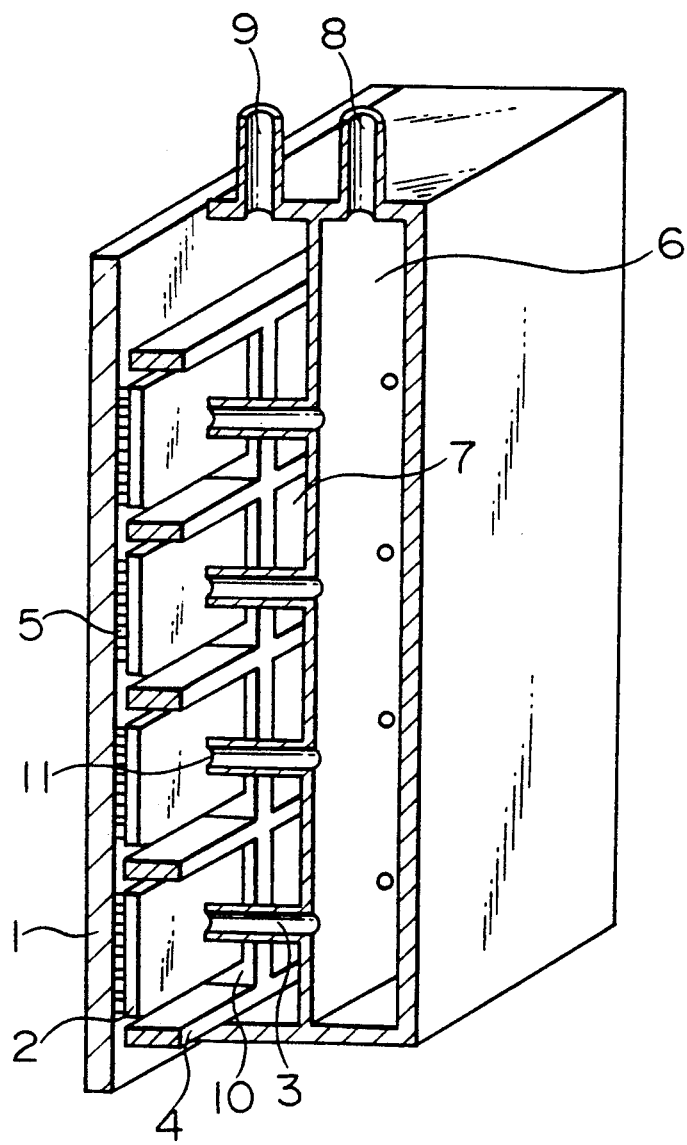
FIG. 1 is a sectional perspective view of a first embodiment of the present invention.
Figure 2:
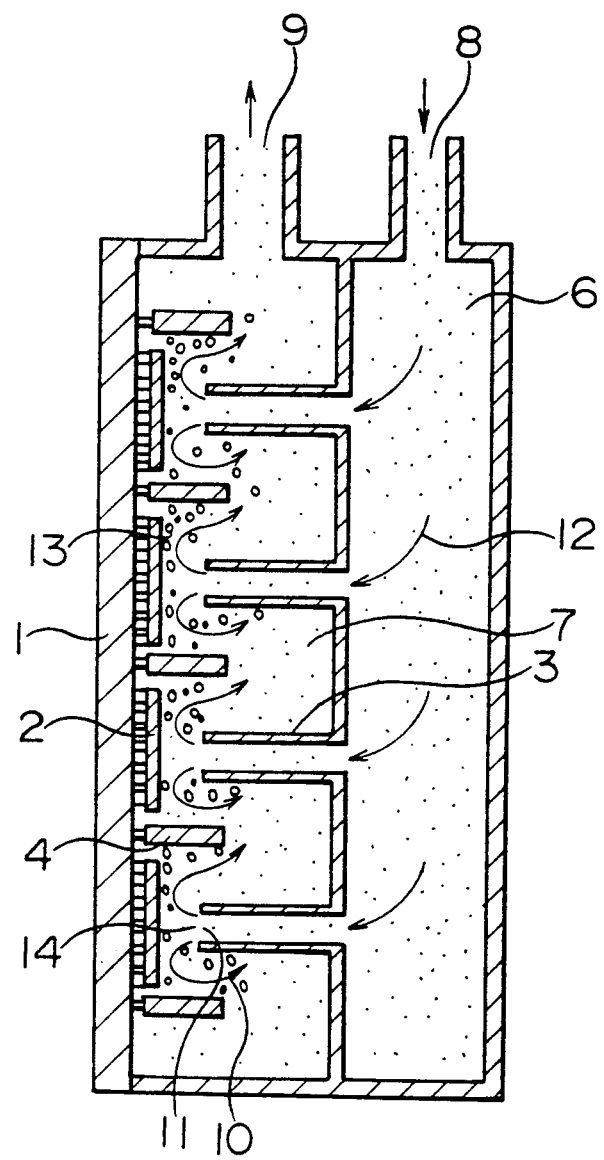
FIG. 2 is a cross-sectional view of the operation of the embodiment shown in FIG. 1.

As shown in FIGS. 1 and 2, a multiplicity of semiconductor devices (elements) 2 are arranged on a substrate 1 in the form of a plate with electrical connection members 5 interposed therebetween, and tubular liquid supply members 3 each communicating with a liquid supply header 6 are disposed so as to projects from the header 6 toward the devices 2. Each liquid supply member 3 has a cooling medium jet port 11 at its projecting end. Partition members 4 having a predetermined height partition an internal space at positions between the devices 2 to define device cooling cells 14. Liquid jet ports 11 project into the device cooling cells 14 to a position at a predetermined distance from the back surfaces of the devices 2. A liquid return header 7 is defined between the device cooling cells 14 partitioned by the partition members 4 and the liquid supply header 6. Each device cooling cells 14 has a liquid discharge opening 10 on the side remote from the device surface, which is fully opened to the liquid return header 7.

Figure 3:
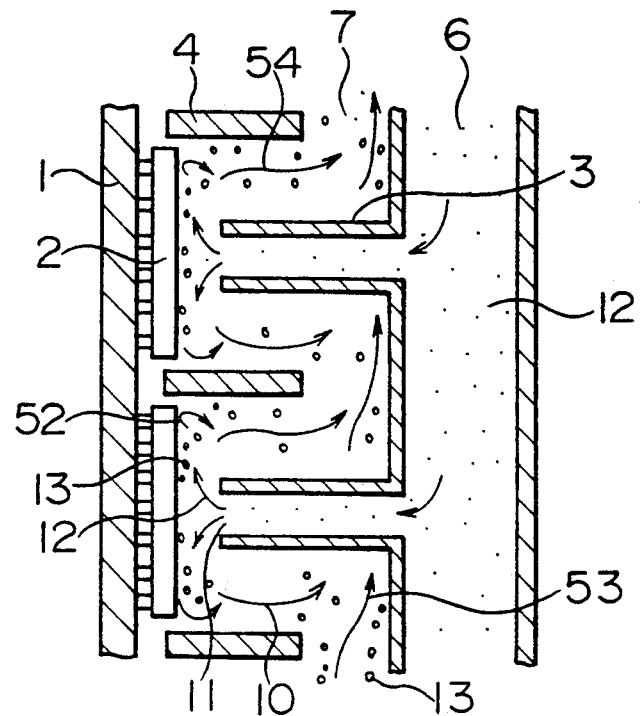
FIG. 3 is another cross-sectional view of the operation of the embodiment shown in FIG. 1.

The operation of this embodiment will be described below with reference to FIGS. 2 and 3. A subcooled liquid liquid 2, which is a low-boiling-point dielectric liquid represented by, e.g., fluorocarbon having a boiling point lower than the device temperature, is led from a liquid inlet pipe 8 to the liquid supply header 6 and is delivered to liquid supply members 3 to be ejected as a jet flow to back surfaces of the devices 2. The jet flow impinges against the each device 2 and flow radially along the back surface thereof by changing their direction by 90°. At this time, the liquid liquid 12 is heated by absorbing heat from the devices 2 and flows downstream while generating bubbles 13. The liquid containing bubbles 13 is checked by the partition members 4 to change its flowing direction by 90° again and flows out of each device cooling cell 14 to the liquid return header 7. The cooling medium in the device cooling cells 14 is thereby collected and is discharged out of the unit through a liquid outlet pipe 9.

In accordance with this embodiment, the liquid supply members 3 are projecting into the device cooling cells 14 by passing through the liquid return header 7, so that the jet flow can reach the back surface of each device without being influenced by the flow in the liquid return header 7 flowing in directions perpendicular to the direction of the jet flow. It is thereby possible to prevent a reduction in the jet speed with diffusion of the jet flow, i.e., an increase in the jet flow diameter, and a movement of the collision point caused by bending of the jet flow. The jet flow which has impinged against the back surface of each device 2 in this manner without being influenced by the circumferential flow flows out of the collision area while forming a very thin velocity boundary layer and forming a maximum velocity region very close to the back surface of the device 2, so that the velocity gradient in the vicinity of the collision area on the device 2 can be greatly increased, thereby limiting the growth of the temperature boundary layer on the back surface of the device 2. Consequently, it is possible to prevent the liquid vapor bubbles generated and growing on the back surface of each device 2 from increasing excessively in size and amount and, hence, to prevent burnout of the devices 2. It is also possible to limit the reduction in heat transfer coefficient and the increase in the degree of non-uniformity of the device temperature due to an excessive increase in the amount of bubbles (the percentage of voids).

Also, in accordance with this embodiment, the partition members 4 are provided to fully surround each device 2 at peripheral ends thereof, so that mixing 52 of vapor bubbles and the liquid of the cooling medium at end portions of each device 2 can be facilitated. It is thereby possible to facilitate condensation or elimination of bubbles 13 in the liquid and, hence, to reduce the size and the amount of bubbles in a vapor-liquid two-phase flow 54 flowing out to the liquid return header 7. Consequently, it is possible to reduce the pressure loss in the liquid return header 7 and the liquid outlet pipe 9 and to stably maintain the flow in the system. Also, by strong vapor-liquid mixing at the peripheral end of each device 2, the heat transfer coefficient at the end is increased and a heat transfer coefficient distribution, which may be such that, in the case of an ordinary jet flow, the heat transfer coefficient at the center is increased while the heat transfer coefficient at the peripheral end is reduced, can be made uniform, so that the average heat transfer coefficient of the whole device surface can be enhanced. It is therefore possible to make a temperature distribution in each device uniform and to obtain enhanced cooling performance.

Further, the partition members 4 separate the cooling/bubbling region in the device cooling cells for each device, in which the liquid impinges against the device surface and bubbles to cool the device, from the liquid return header 7, in which the bubbly flows generated at the surfaces of devices 2 are collected to be discharged.

It is thereby possible to prevent the bubbly flow generated at each device from flowing into other device cooling cells. It is also possible to prevent occurrence of movement of a large amount of bubbles to some of the devices, an extreme deterioration of the cooling performance caused by staying of bubbles and non-uniformity of the temperatures of the devices due to the differences between the amounts of bubbles at the devices 2. Further, each bubbly flow bent through 90° by the partition members 4 and having a velocity component such as to move away from the device 2 acts to keep the bubbly flow in the liquid return header 7 away from the device 2, which bubbly flow in the return header 7 flows perpendicularly to the former flow and has a large amount of bubbles. That is, the bubbly flow in the liquid return header is thereby prevented from interfering with each device. These various effects are markedly large in the case of vertically setting the substrate as in this embodiment. It is thereby possible to prevent bubbles generated at devices in lower positions from being successively collected in upper device regions so as to cover and dry out the devices in the uppermost position.

In the case of cooling semiconductor devices by directly immersing in a liquid, it is required that the liquid has an electrical insulating property and chemical stability. However, ordinary liquid of this type have a large density. For example, the density of perfluoro normal hexane is about 1.7 times higher than that of water. For this reason, in a case where the substrate is set vertically in the bobble generation system as in this embodiment, the potential head between one liquid supply member in a upper position and another liquid supply member in a lower position is so large that the rates of supply of the liquid to the cooling medium supply members vary easily. In the structure of this embodiment in which both the liquid inlet pipe 8 and the liquid outlet pipe 9 are placed above the substrate, such a potential head unbalance can be solved and the non-uniformity of the device cooling performance due to the differences between the rates of supply of the liquid to the cooling medium supply members can be reduced. This function is effective only when the size of the substrate is large, that is, a large potential head is set. If the size of the substrate is small, the liquid inlet pipe and the liquid outlet pipe may be provided in different positions, i.e., in a side surface or a bottom surface. While the substrate is vertically set in this embodiment, the functions and effects of this embodiments can also be achieved in the case of horizontally setting the substrate.

Figure 4:
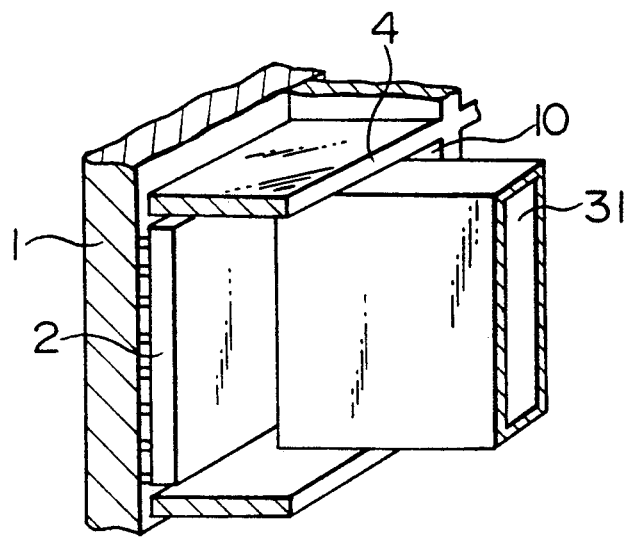
FIG. 4 is a sectional perspective view of a liquid supply member in accordance with a second embodiment of the present invention.

FIG. 4 is a perspective view of the second embodiment of the present invention, mainly illustrating a liquid supply member. This cooling medium supply member differs from that of the first embodiment shown in FIG. 2 in that it has a rectangular cross section. In this embodiment, a flow of the liquid jetted from each of cooling medium supply members 3 in the form of rectangular tubes has the shape of a two-dimensional jet flow such that the flow velocity along the back surface of each device is uniform in comparison with the three-dimensional jet flow in the first embodiment shown in FIG. 2, in which the liquid after collision against each device spreads radially along the back surface of the device so that the flow velocity is reduced with respect to the distance from the center of the device in the downstream direction. In the second embodiment, therefore, the temperature distribution in each device can be made more uniform.

Figure 5:
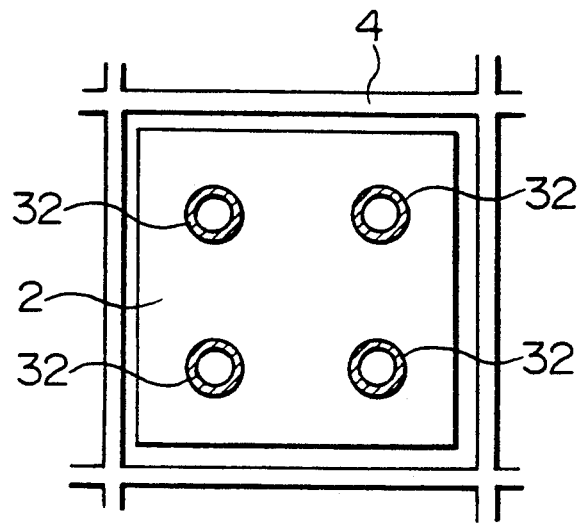
FIG. 5 is a cross-sectional view of liquid supply member in accordance with a third embodiment of the present invention.

FIG. 5 is a cross-sectional view of liquid supply members in accordance with the third embodiment of the present invention. A structural feature of this embodiment resides in that four tubular liquid supply members 32 are disposed with respect to one semiconductor device 2. In this embodiment, while the flow velocity distribution over the back surface of each device can be reduced so that the temperature distribution in each device is more uniform as in the second embodiment shown in FIG. 4, the thickness of the velocity boundary layer can be reduced so that the cooling performance is improved in comparison with the arrangement using one liquid supply member with respect to one semiconductor device. Further, the jet flows from the liquid supply members 32 impinge strongly against each other to facilitate vapor-liquid mixing so that the effect of reducing and eliminating bubbles is improved. Needless to say, in this embodiment, the number of liquid supply members for one semiconductor device is not limited to four and may be selected according to the size and the heat load of the semiconductor device. Also, the cross-sectional configuration of each liquid supply member is not limited to the circular section shown in FIG. 5.

Figure 6:
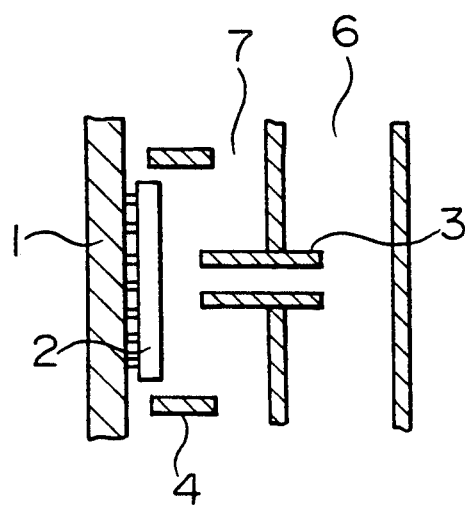
FIG. 6 is a cross-sectional view of a liquid supply member in accordance with a fourth embodiment of the present invention.

FIG. 6 is a cross-sectional view of a liquid supply member in accordance with the fourth embodiment of the present invention. A structural feature of this embodiment resides in that an end of each liquid supply member 3 projects into liquid supply header 6. A non-uniform static pressure distribution is exhibited at each liquid discharge opening 10 of the respective devices because of variations in the flow velocity in liquid return header 7 and variations in the distribution of flow velocity in the direction of the liquid flow containing bubbles. If the semiconductor devices have different heat loads, the amounts of bubbles generated at the devices vary to cause some differences between the static pressures at the respective liquid jet ports 11. These non-uniform static pressure distributions result in differences between the rates of supply of the cooling medium from the respective liquid supply members 3 to the respective devices 2 and instability of the flows in these paths. However, in the case of the structure of this embodiment wherein each liquid supply member 3 has a projecting upstream end, the resistance to the flow at an inlet portion of each liquid supply member is increased so as to limit the non-uniformity of the liquid supply rates and the flow instability due to the above-described non-uniform static pressure distributions. It is thereby possible to make the temperatures of the devices uniform and to reduce the change in the device temperature with respect to time. In the arrangement described above with respect to this embodiment, the projecting end surface has a shape such as to be parallel with the device back surface. However, the end portion may be formed as a knife edge to further improve the above-described effects.

Figure 7:
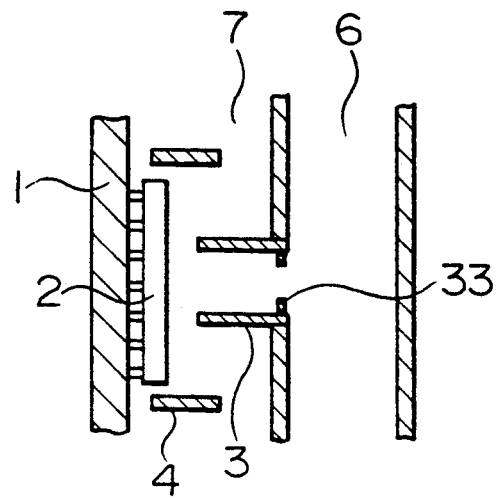
FIG. 7 is a cross-sectional view of a liquid supply member in accordance with a fifth embodiment of the present invention.

FIG. 7 is a cross-sectional view of a liquid supply member in accordance with the fifth embodiment of the present invention. An orifice 33 is provided at a liquid inlet portion of each liquid supply member 3. In this embodiment, the resistance to the flow at the inlet portion of each liquid supply member can be greater than that in the fourth embodiment, so that more uniform flow rate distribution can be effected without being influenced by the condition on the downstream side.

Figure 8:
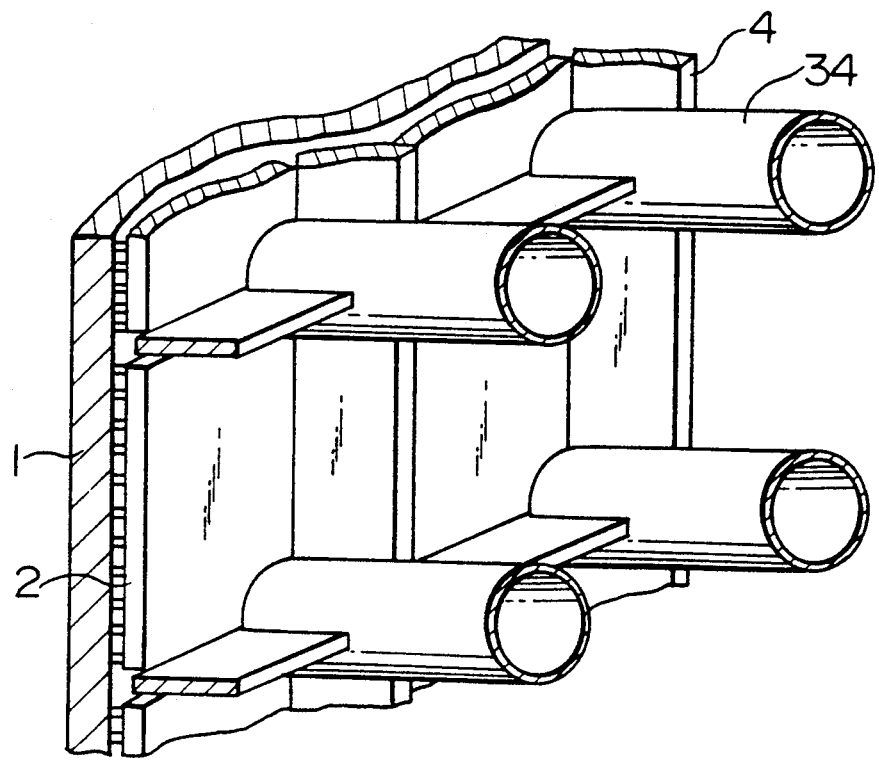
FIG. 8 is a cross-sectional view of liquid supply members in accordance with a sixth embodiment of the present invention.

FIG. 8 is a sectional perspective view of liquid supply members in accordance with the sixth embodiment of the present invention. Tubular liquid supply members 34 are fitted to lattice crossing portions of partition members 4 while being spaced from the device back surfaces. In this embodiment, the size of the opening through which the liquid is discharged out of each device cooling cells can be increased so that the resistance to the flow at the discharge opening is reduced. Consequently, bubbles generated on the device back surfaces can be discharged more rapidly and the device cooling performance can be improved. Moreover, the number of liquid supply members in the whole cooling unit can be reduced in comparison with the arrangement using a plurality of liquid supply members 32 as shown in FIG. 5, so that the flow loss of the flow in the liquid return header flowing transversely to liquid supply members can be reduced.

Figure 9:
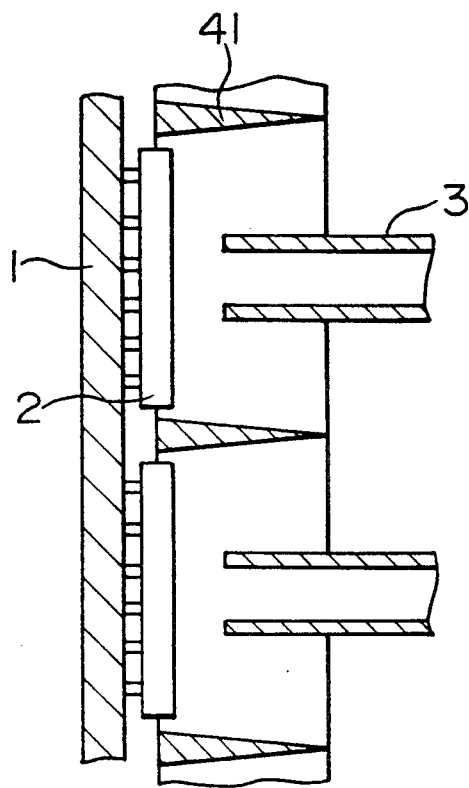
FIG. 9 is a sectional perspective view of partition members in accordance with a seventh embodiment of the present invention.

FIG. 9 is a cross-sectional view of partition members in accordance with the seventh embodiment of the present invention. Each of partition members 41 has a tapered sectional shape along the direction of its height such that its thickness is reduced from its end closer to the devices toward the other end at the liquid return header. In this embodiment, it is thereby possible to prevent bubbles from staying at corners defined by the partition members 41 and each device 2, so that the temperature distribution in each device can be made more uniform.

Figure 10:
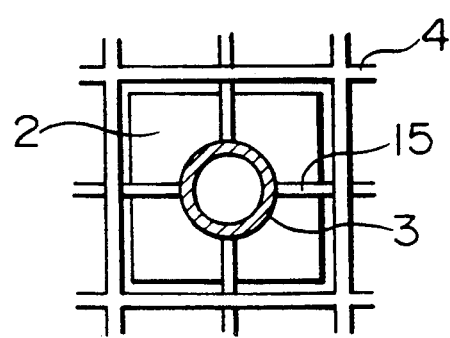
FIG. 10 is a cross-sectional view of partition member attachment portions in accordance with an eighth embodiment of the present invention.

FIG. 10 is a cross-sectional view of a method of fixing partition members in accordance with the eighth embodiment of the present invention. Partition members 4 are fixed on liquid supply members 3 through stays 15.

Figure 11:
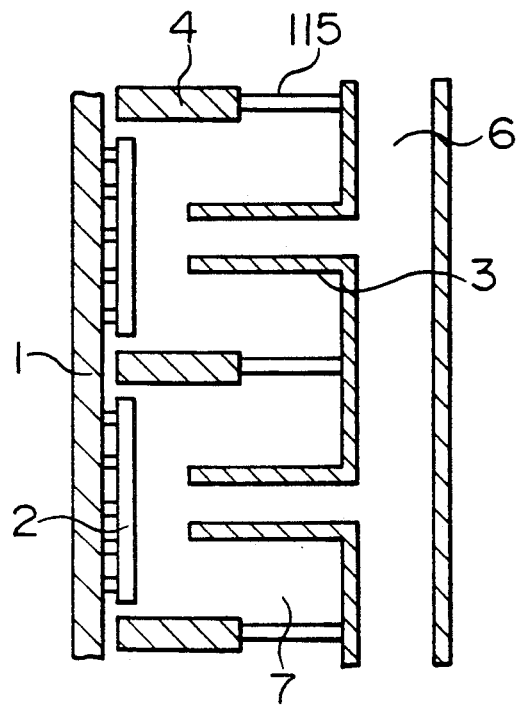
FIG. 11 is a cross-sectional view of partition member attachment portions in accordance with a ninth embodiment of the present invention.

FIG. 11 is a cross-sectional view of a method of fixing partition members in accordance with the ninth embodiment of the present invention. Partition members 4 are fixed on a wall of liquid supply header 6 through stays 115. The methods in accordance with embodiments shown in FIGS. 10 and 11 facilitates assembling the cooling unit. In these embodiments, a group of fixing stays is provided in correspondence with each of square partitions defined by the partition members. However, needless to say, a single stay may be provided with respect to a plurality of square partitions. If the partition members are fixed on the liquid supply members or the liquid supply header, the operation of assembling the unit or repairing devices can be facilitated.

Figure 12:
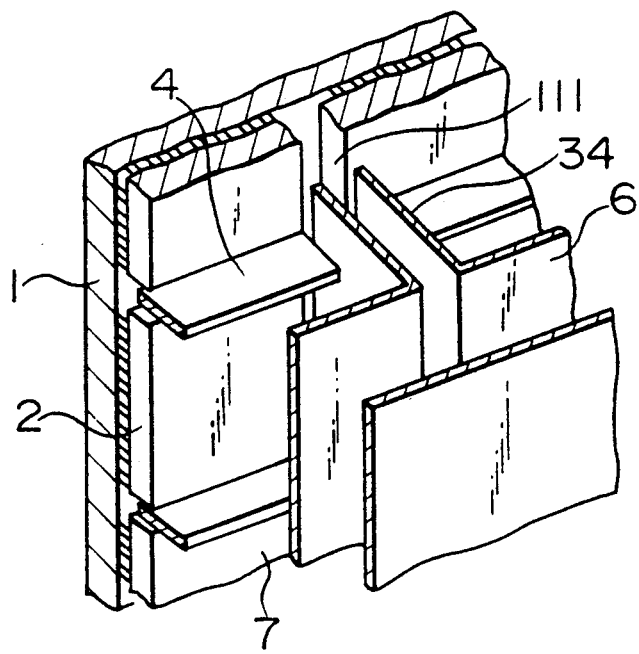
FIG. 12 is a sectional perspective view of a liquid supply member in accordance with a tenth embodiment of the present invention.

FIG. 12 is a sectional perspective view of the tenth embodiment of the present invention. A liquid supply member 34 forming a flow path having a rectangular cross-section is disposed between each of adjacent pairs of semiconductor devices 2, and partition members 4 are disposed so as to extend perpendicularly to the liquid supply members 34. In this embodiment, the liquid supply members 34 also serve as partition members 4 exclusively used for partitioning. It is thereby possible to improve the device packaging density. Moreover, the liquid jetted through each of liquid jet ports 111 flows as a wall jet flow along the cooled flat surfaces (back surfaces) of the semiconductor devices, so that the temperature distribution in each device can be more uniform. It is also possible to reduce the flow loss in return paths, because there is no obstruction in the flow paths of a liquid return header 7.

Figure 13:
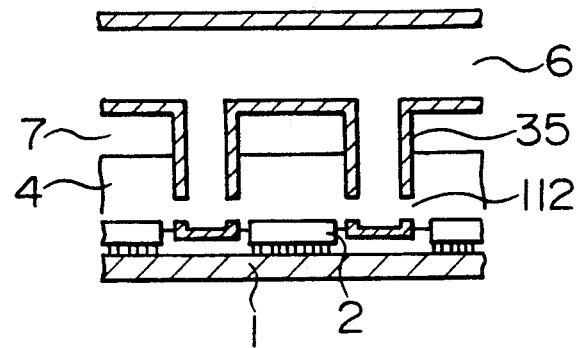
FIG. 13 is a cross-sectional view of liquid supply members in accordance with an eleventh embodiment of the present invention.

FIG. 13 is a transverse sectional view of the eleventh embodiment of the present invention. Each of liquid supply members 35 has a closed end surface on the semiconductor device 2 side, and liquid jet ports 112, which are holes through which the liquid is jetted out of each liquid supply member, are formed in side portions of the liquid supply member 35 facing toward adjacent devices. In this embodiment, therefore, the liquid can be prevented from being directly jetted to repair wires which are laid on the substrate between the devices to repair the circuit system or to change the logic thereof, thereby preventing disconnection of such repair wires caused by the fluid force.

Figure 14:
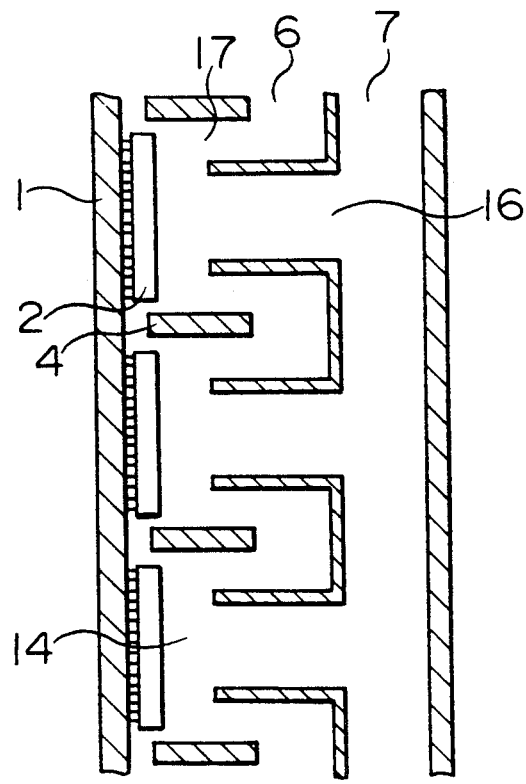
FIG. 14 is a cross-sectional view of a device cooling section in accordance with a twelfth embodiment of the present invention.

FIG. 14 is a cross-sectional view of the twelfth embodiment of the present invention. Liquid supply header 6 is provided between a cooling liquid return header 7 and device cooling cells 14 partitioned by partition members 4, and liquid discharge members 16 are arranged so as to project from liquid return header 7 into device cooling cells 14. Liquid jet ports 17 are formed between partition members 4 and cooling medium discharge members 16. The liquid distributed from cooling medium supply header 6 to each liquid jet port reaches the cooled flat surface (back surface) of the corresponding semiconductor device, cools the device while generating bubbles, and passes through liquid discharge members 16 to be discharged into liquid return header 7. In this embodiment, since liquid return header 7 is separated from device cooling cells 14, the liquid flowing in liquid return header 7 can be prevented from flowing into device cooling chambers 14. It is therefore possible to uniformly set the liquid condition with respect to the respective semiconductor devices so as to make the temperatures of the devices uniform, even if the heat load is very large or the amount of bubbles in cooling medium return header 7 is increased by an increase in the number of mounted devices.

Figure 15:
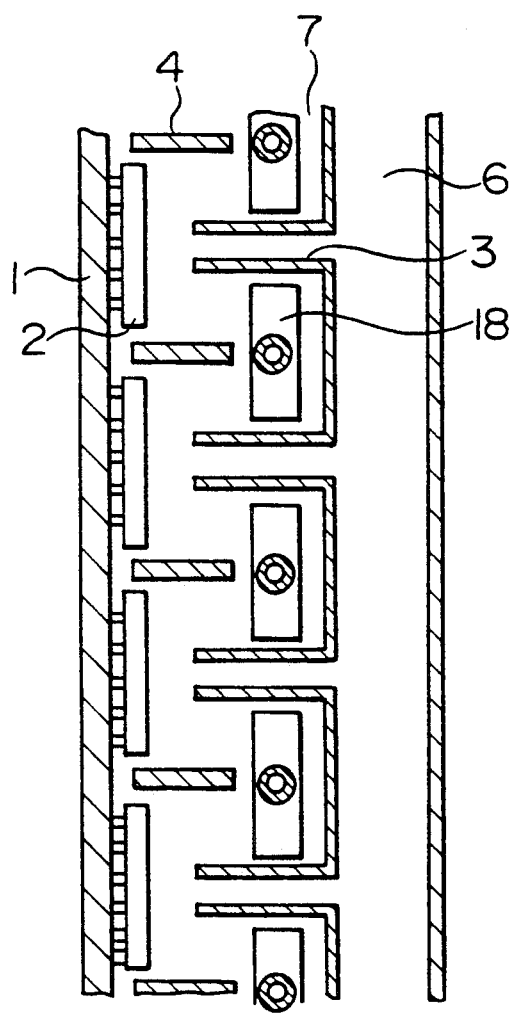
FIG. 15 is a cross-sectional view of a device cooling section in accordance with a thirteenth embodiment of the present invention.

FIG. 15 is a cross-sectional view of the thirteenth embodiment of the present invention. The structure of this embodiment is such that cooler 18 for eliminating bubbles are provided in liquid return header 7 in the arrangement of the first embodiment shown in FIG. 2. Bubbles generated at semiconductor devices are immediately condensed and disappear in the liquid return header to reduce the flow loss in the liquid return header and also to change a vapor-liquid two-phase flow, by which flow instability is caused, into a single-phase flow to stabilize the flow condition at each device. It is thereby possible to stabilize the device temperature.

Figure 16:
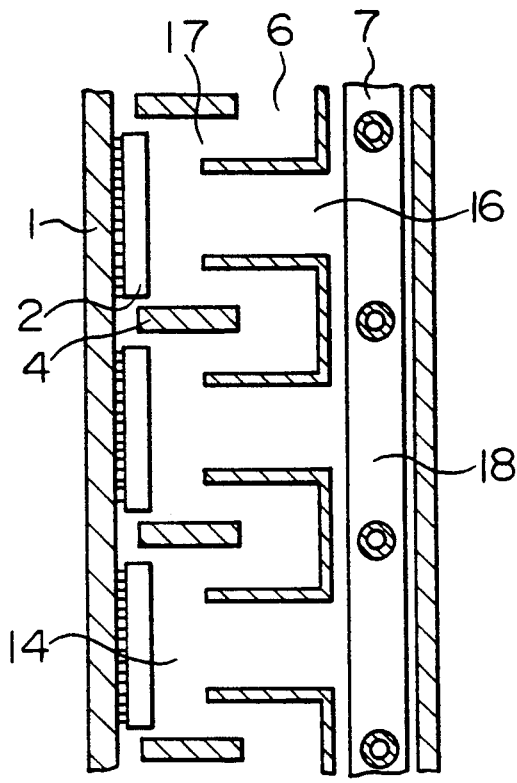
FIG. 16 is a cross-sectional view of a device cooling section in accordance with a fourteenth embodiment of the present invention.

FIG. 16 is a cross-sectional view of the fourteenth embodiment of the present invention. The structure of this embodiment is such that cooler 18 for eliminating bubbles are provided in liquid return header 7 in the arrangement of the twelfth embodiment shown in FIG. 12. This embodiment has the same effect and advantage as the thirteenth embodiment shown in FIG. 15.

Figure 17:
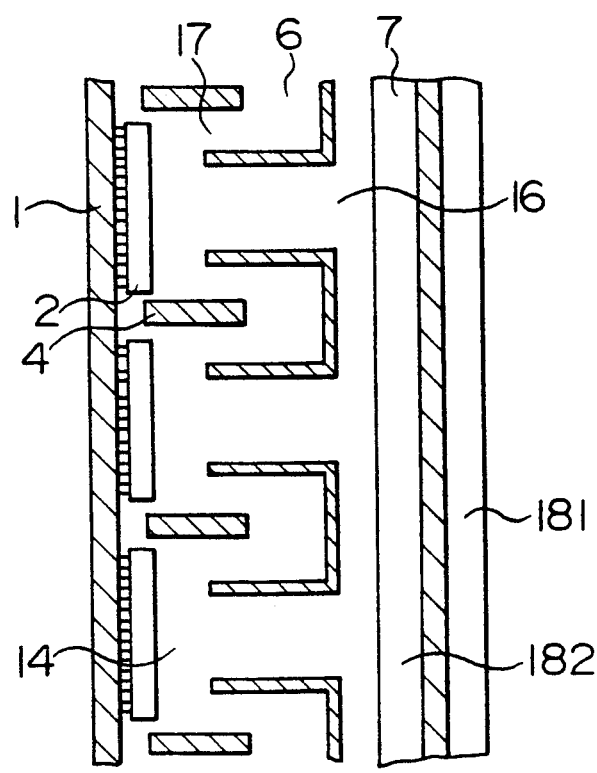
FIG. 17 is a cross-sectional view of a device cooling section in accordance with a fifteenth embodiment of the present invention.

FIG. 17 is a cross-sectional view of the fifteenth embodiment of the present invention. A cooling fin 182 for eliminating bubbles is provided in liquid return header 7 while an external cooling fin 181 is provided on the outside of liquid return header 7. External cooling fin 181 cooled by an external fluid serves as a low-temperature source to cool cooling fin 182 on the liquid side, thereby condensing and eliminating bubbles. This embodiment also has the same effect and advantage as the thirteenth embodiment shown in FIG. 15.

In accordance with the present invention, as described above, liquid supply members and partition members serving as partitions between semiconductor devices (elements) are arranged in correspondence with the semiconductor devices, so that jet flows from the liquid jet ports do not interfere with each other, and bubbles generated at one device are prevented from flowing into the region of other devices, that is, the devices are cooled independently. The differences between the temperatures of the devices are therefore reduced. Since the devices are cooled by utilizing boiling of a jet flow liquid of the liquid subcooled from the saturation temperature, the development of the temperature boundary layer is limited. The size and the amount of liquid vapor bubbles generated at the device surface are therefore reduced. Further, in the impingement region where the jet flow from each liquid jet port impinges against the device, the liquid liquid and the cooling medium vapor bubbles are violently mixed to enable vapor bubbles generated at the device to be condensed and disappear in the liquid liquid. The percentage of voids (the proportion of bubbles in the liquid) at the liquid outlet above each device is thereby reduced, so that the flow pressure loss of the vapor-liquid two-phase flow is reduced. A two-phase pattern bubbly flow is formed to enable stabilization of the flow through the entire system. By this stabilization of flow through the entire system, the rate of supply of the liquid to each device is stabilized and the size and the amount of bubbles at each device are stabilized, and variations in the pressure at each device can be reduced, so that the spatial non-uniformity and the change with respect to time of the temperature of each device are reduced. If variations in pressure are reduced, the load imposed upon each device or the substrate becomes constant, thereby preventing fatigue failure caused by repeated load.

With respect to cooling performance, the above-described violent mixing of the vapor and the liquid enables an increase in the jet boiling heat transfer coefficient and, hence, removal of large amount of heat from each device, and also enables heat transfer coefficient distribution at the time of single-phase liquid jet heat transfer to be made flat so that the temperature distribution on the device back surface is reduced. Further, the violent mixing of the vapor and the liquid on the device back surface limits burnout occurring at a device end remotest from the jet flow center and acts to increase the burnout heat flux. The cooling performance with respect to the device calorific value is thereby improved, so that the gate density in each device can be increased.

According to the present invention, bubbles of the liquid generated at each semiconductor device can be prevented from flowing into the region of other devices. The differences between the temperatures of the devices can be reduced by independently cooling the devices. Further, a turbulence is caused in the liquid flow at each device to violently mix the vapor and the liquid so that the cooling performance is improved, while bubbles are caused to reduce and disappear to stabilize the main flow so that the device temperatures are uniform and stable. It is thereby possible to increase the degree of device integration, to limit the temperature drift of the devices and to increase the speed of computer logical operation.

What is claimed is:

1. In a liquid-impingement cooling module having a liquid supply header for distributing a liquid to a plurality of liquid supply members each having a liquid jet port through which the liquid is jetted against respective semiconductor devices mounted on a substrate, and a liquid return header for discharging the jetted liquid from around the semiconductor devices, the improvement comprising a plurality of partition members provided between the respective semiconductor devices to define both a plurality of device cooling cells therebetween and a liquid return header between the liquid supply header and the partition members;

said partition members and said liquid supply members defining flow guiding paths therebetween for guiding the liquid being jetted against the semiconductor devices to the liquid return header from the semiconductor devices in a direction perpendicular to the back surfaces of the semiconductor devices;

each of said device cooling cells being opened to the liquid return header at a ceiling portion thereof to define a liquid discharge opening for discharging the liquid from said each device cooling cell and having a cross sectional area equal to that of the flow guiding path; and said liquid supply members extending into said device cooling cells to have the liquid jet ports disposed within said device cooling cells.

2. A liquid-impingement cooling module according to claim 1, wherein each liquid jet port has a circular cross-sectional shape and a flow of the liquid jetted through each liquid jet port forms a three-dimensional jet flow.

3. A liquid-impingement cooling module according to claim 1, wherein each liquid jet port has a rectangular cross-sectional shape and a flow of the liquid jetted through each liquid jet port forms a two-dimensional jet flow.

4. A liquid-impingement cooling module according to claim 1, wherein one end of each liquid supply member projects into said liquid supply header.

5. A liquid-impingement cooling module according to claim 1, wherein each liquid supply member has one of an orifice and a restriction at its opening communicating with said liquid supply header.

6. A liquid-impingement cooling module according to claim 1, wherein said partition members are connected to each other to be formed into a lattice-like shape.

7. A liquid-impingement cooling module according to claim 1, wherein said partition members are connected to each other to be formed into a lattice-like shape and each partition member is formed so as to have one of a triangular and a trapezoidal cross-sectional shape along a height direction thereof such that a bottom side of the shape is closer and generally parallel to the semiconductor devices.

8. A liquid-impingement cooling module having a liquid supply header for supplying a liquid to a plurality of semiconductor devices mounted on a substrate, a plurality of liquid supply members projecting from said liquid supply header and capable of supplying the liquid to back surfaces of the semiconductor devices, and a liquid return header communicating with each liquid supply member and disposed adjacent to said liquid supply header, said liquid cooling module comprising:

a lattice member having a predetermined height and partitioning an internal space at positions between the respective semiconductor devices to define a plurality of device cooling cells;

a plurality of liquid jet ports provided on ends of the liquid supply members on the semiconductor device side;

said liquid supply members being fitted to lattice crossing portions of said lattice member while being spaced at a predetermined distance from the semiconductor devices;

said lattice member and said liquid supply members defining liquid discharge openings therebetween, said lattice member and the liquid supply header defining said liquid return header therebetween, and a guide flow path provided at a position surrounded by the liquid supply members and the lattice members to guide the liquid jetted to the back surface of each semiconductor device to said liquid return header away from the back surface of the semiconductor device.

9. A liquid-impingement cooling module having a liquid supply header for supplying a liquid to a plurality of semiconductor devices mounted on a substrate, at least one liquid supply member projecting from said liquid supply header and capable of supplying the liquid to a back surface of each semiconductor device, and a liquid return header communicating with each liquid supply member and disposed adjacent to said liquid supply header, said liquid-impingement cooling module comprising:

one liquid supply member fixed and spaced at a predetermined distance from the semiconductor device, said liquid supply member having a flow path with a rectangular cross-sectional shape;

a plurality of partition members having a predetermined shape and extending perpendicularly to said liquid supply member to define a plurality of device cooling cells;

said partition members and said liquid supply members defining liquid discharge openings therebetween, said partition members and the liquid supply header defining said liquid return header therebetween; and a guide flow path provided at a position surrounded by the liquid supply members and the partition members to guide the liquid jetted to the back surface of each semiconductor device to said liquid return header away from the back surface.

10. A liquid-impingement cooling module according to claim 9, wherein each liquid supply member is closed at a bottom end thereof and at least one liquid jet port is formed in an upper portion of the closed end surface of each liquid supply member to jet the liquid in a direction substantially parallel to the back surface of the semiconductor device.

11. A liquid-impingement cooling module according to claim 9, wherein said liquid supply member is disposed in a vertical direction while said partition members are disposed in a horizontal direction.

12. A liquid-impingement cooling module according to claim 1, wherein said liquid supply member has a variable flow path sectional area depending upon the heat loads of the corresponding semiconductor device.

13. A liquid-impingement cooling module according to claim 1, wherein said liquid supply member has an large flow path sectional area with respect to at least one of the semiconductor devices having a large heat load, and has a small flow path sectional area with respect to at least one of the semiconductor devices having a small heat load.

14. A liquid-impingement cooling module having a liquid supply header for supplying a liquid to a plurality of semiconductor devices mounted on a substrate, at least one liquid jet port projecting from said liquid supply header and capable of jetting the liquid against a back surface of each semiconductor device, a liquid discharge member disposed adjacent to said liquid jet port, and a liquid return header communicating with each liquid jet port and disposed adjacent to said liquid supply header said liquid-impingement cooling module comprising:

a plurality of partition members having a predetermined height for partitioning an internal space at positions between the semiconductor devices to define a plurality of device cooling cells;

each liquid jet port being provided at an end of said liquid discharge member on the semiconductor device back surface side;

said liquid discharge member being disposed so as to extend into a corresponding one of said device cooling cells to a position at a predetermined distance from the back surface of the corresponding semiconductor device;

each liquid discharge member being connected to said liquid return header;

each partition member and the adjacent liquid discharge member defining said at least one liquid jet port; and the liquid jetted to the back surface of each semiconductor device being led to said liquid return header away from the back surface.

15. A liquid-impingement cooling module according to claim 1, wherein said liquid is formed of one of a low boiling temperature liquid and fluorocarbon having a saturation temperature lower than the temperature of each semiconductor device.

16. A liquid-impingement cooling module according to claim 1, wherein the substrate on which the semiconductor devices are arranged is vertically set, and further comprising a liquid inlet pipe for supplying the liquid to said liquid supply header being connected to an upper end portion of said liquid supply header, a liquid outlet pipe for discharging the liquid out of said liquid return header being connected to an upper end portion of said liquid return header.

17. A liquid-impingement cooling module according to claim 1, wherein the substrate on which the semiconductor devices are arranged forms a part of a sealed container in which the liquid is enclosed.

18. A liquid-impingement cooling module according to claim 1, further comprising a cooler provided in said liquid return header for cooling the liquid as its temperature is increased by receiving heat generated from each semiconductor device.

19. A liquid-impingement cooling module according to claim 1, further comprising at least one cooling fin provided on an outer wall of said liquid return header for cooling the liquid as its temperature is increased by receiving heat generated from each semiconductor device.

20. A liquid-impingement cooling module according to claim 1, wherein each of said partition members has a tapered cross-sectional shape in a height direction thereof reduced in thickness from the semiconductor device side to the liquid return header side.

21. A liquid-impingement cooling module according to claim 1, wherein each of said partition member is fixed to each said liquid supply members.

22. A liquid-impingement cooling module according to claim 1, wherein each of said partition members is fixed to said liquid supply header.

23. A liquid-impingement cooling module according to claim 14, wherein each of said partition members is fixed to said liquid discharge member.

24. A liquid-impingement cooling module according to claim 14, wherein each of said partition member is connected to said liquid return header.

* * * * *